(12) United States Patent
Iwasaki

(10) Patent No.: US 7,267,731 B2
(45) Date of Patent: Sep. 11, 2007

(54) METHOD AND SYSTEM FOR FABRICATING THREE-DIMENSIONAL MICROSTRUCTURE

(75) Inventor: Kouji Iwasaki, Chiba (JP)

(73) Assignee: SII NanoTechnology Inc. (JP)

( * ) Notice: Subject to any disclaimer, the term of this patent is extended or adjusted under 35 U.S.C. 154(b) by 440 days.

(21) Appl. No.: 10/712,147

(22) Filed: Nov. 13, 2003

(65) Prior Publication Data

US 2004/0129351 A1 Jul. 8, 2004

(30) Foreign Application Priority Data

Nov. 14, 2002 (JP) ............................. 2002-330845
Mar. 7, 2003 (JP) ............................. 2003-060883

(51) Int. Cl.
*C21D 1/54* (2006.01)
(52) U.S. Cl. ........................................ 148/508; 205/80
(58) Field of Classification Search ................. 148/508, 148/509; 205/80
See application file for complete search history.

(56) References Cited

U.S. PATENT DOCUMENTS 5,641,391 A * 6/1997 Hunter et al. .................. 205/80
6,875,544 B1 * 4/2005 Sweatt et al. .................. 430/5
2002/0053643 A1 * 5/2002 Tanaka et al. ............ 250/491.1
2004/0099636 A1 * 5/2004 Scipioni ....................... 216/66

* cited by examiner

*Primary Examiner*—Scott Kastler
(74) *Attorney, Agent, or Firm*—Adams & Wilks

(57) ABSTRACT

A method of fabricating a three-dimensional microstructure provides data corresponding to information relating to the structure of a three-dimensional microstructure design. A sample is processed in accordance with the provided data by irradiating the sample with a charged-particle beam while controlling processing conditions of the charged-particle beam. Dimensions of the processed sample are compared with the provided data to identify differences between the structure of the processed sample and the structure of the three-dimensional microstructure design. The sample is then irradiated again with a charged-particle beam to correct the identified structural differences while adjusting the processing conditions of the charged-particle beam to thereby fabricate a three-dimensional microstructure having a structure substantially the same as the structure of the three-dimensional microstructure design.

18 Claims, 5 Drawing Sheets

FUNDAMENTAL CONCEPT

CAD ORIGINAL

IMAGE OF PROTOTYPE

FINISHED PRODUCT

FIG. 3A
FIG. 3B
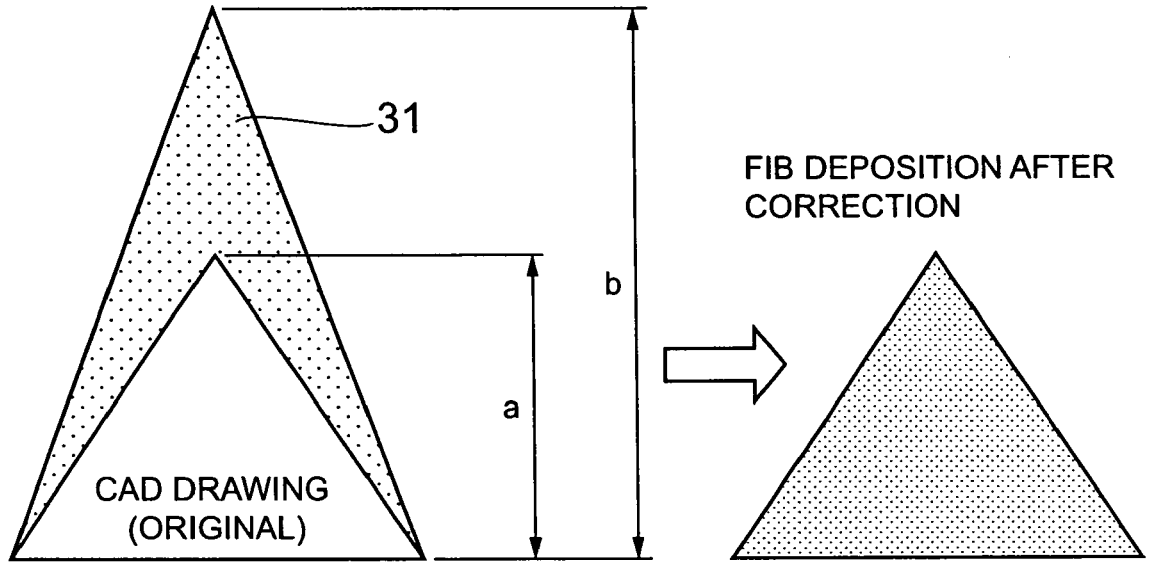
FIG. 4A
FIG. 4B
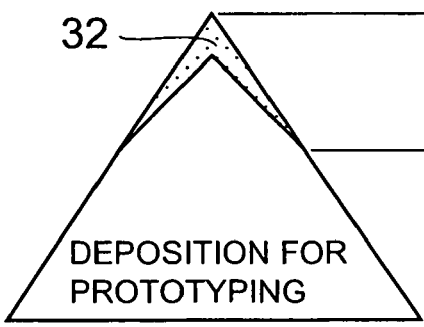

METHOD AND SYSTEM FOR FABRICATING THREE-DIMENSIONAL MICROSTRUCTURE

BACKGROUND OF THE INVENTION

1. Field of the Invention

The present invention relates to techniques for forming a three-dimensional microstructure by (i) a CVD process consisting of irradiating a sample surface with a focused ion beam or electron beam while blowing a source gas against the surface, (ii) an etching process consisting of irradiating a sample surface with a focused ion beam, or (iii) another etching process consisting of irradiating a sample surface with a focused ion beam or electron beam while blowing an etchant gas against the surface.

2. Description of Related Art

So-called microstereolithography making use of photopolymerization reactions using a synthetic resin material is known as a technique for creating a three-dimensional microstructure. With this method, however, only structures having sizes on the micrometer order or greater can be fabricated. It is difficult to provide controls on the submicrometer to nanometer order. Furthermore, the usable materials are limited to photocurable resins. In this way, there are many limitations. Meanwhile, there is a lot of demand for submicrometer to nanometer-sized three-dimensional microstructures in the form of knives, drills, and manipulator probes used for processing of microscope specimens, spring coils, probes of probe microscopes, and coils of precision electronic circuits. There is a high expectation for supply of techniques of fabricating them. Furthermore, it is considered that these nanometer micromachines will find wide application, ranging from medicine, through biotechnology, audio devices, IT products, and communications to automobiles. It is expected that they will be put into practical use. Attempts have been made to fabricate three-dimensional structures of arbitrary shapes by a CVD microlithography machine using a focused charged-particle beam. In this connection, non-patent Reference 1 (S. Matsui, T. Kaito, J. Fujita, et al., Three-dimensional nanostructure fabrication by focused-ion-beam chemical vapor deposition, "Journal of Vacuum Society" Technol. B18, 2000, Vol. 3168) introduces a method of fabricating a three-dimensional rotational symmetric structure by gradually varying the signal from a pattern generator. Non-patent Reference 2 (R. A. Lee, P. J. Wolpert, FIB Micromachining and Nano-Structure Fabrication, "International Symposium for Testing and Failure Analysis", Nov. 14-18, 1999) introduces a method of fabricating a three-dimensional structure by varying the dose of charged particles in step with the gray levels of a bitmap.

It is considered that processing using a focused ion beam fundamentally progresses in proportion to the dose of irradiating charged particles whether the method is etching or deposition. However, with the above-described prior art method, it is difficult to accurately fabricate the required three-dimensional microshape. One cause of this is that the etch rate varies according to variations in the irradiation angle to the sample or variations in the used material. Another cause is redeposition phenomenon. Unlike two-dimensional processing, a finished shape is not always in proportion to the dose. Furthermore, where deposition is used, the irradiated cross-sectional area of a three-dimensional structure varies in the direction of height. Therefore, if the dose is kept constant, the amount of adsorbed gas varies, thus changing the deposition rate. Hence, an accurate three-dimensional shape cannot be formed.

SUMMARY OF THE INVENTION

It is an object of the present invention to provide a method of creating a three-dimensional microstructure close to a designed shape, using a focused charged-particle beam, by alleviating the effects of variations in the etch rate and deposition rate when the 3D microstructure is fabricated. It is another object of the invention to provide a system implementing this method using such a focused charged-particle beam.

The method of fabricating a three-dimensional microstructure in accordance with the invention starts with performing a provisional processing work based on data about the designed 3D shape of the 3D structure by controlling the processing conditions including the accelerating voltage of the charged particles, beam current, scan rate, dot-to-dot interval, and dot wait time. In this way, a prototypic structure is created. Then, the shape of this prototypic structure is compared with the designed 3D shape. A non-provisional processing work is carried out while correcting the processing conditions so as to correct the differences. CAD data is used as the data about the designed 3D shape of the 3D structure. Plural sets of data about two-dimensional shapes are found by differentiation. The position hit by the charged-particle beam is controlled based on the sets of data about the two-dimensional shapes. In this way, the processing work is performed.

In one aspect of the method of fabricating a three-dimensional microstructure in accordance with the invention, the processing conditions about the charged-particle beam are set as follows. Plural sets of characteristic data showing the relation between the processed area and the deposition rate are obtained in advance. Any one of the following three methods is carried out.

(1) The wait time of the beam scans is adjusted by an amount equal to the (decrease in rate value)/(maximum rate value) according to a decrease in the deposition rate. The same numbers of scans are performed.

(2) A processing work is first performed using a maximum rate region up to the kink (sudden bend) portion of a large beam current. The beam current is switched to the next greatest value in that portion. The maximum rate region is used up to the kink portion at that beam current. Subsequently, the beam current is switched in turn similarly.

(3) The number of repetitions of the beam scan is adjustively increased by an amount equal to (decrease in rate value)/(maximum rate value) according to a decrease in the deposition rate. In this way, scans are made.

A focused charged-particle beam system used for fabricating a three-dimensional microstructure in accordance with the invention has means for obtaining data about a designed three-dimensional shape of a three-dimensional structure, means for controlling the position hit by the charged particle beam based on the data about the shape, means for controlling processing conditions including accelerating voltage, beam current, scan rate, dot-to-dot interval, and dot wait time, means for obtaining images for grasping the three-dimensional shape of the processed structure, and means for comparing the images with the designed shape. This system is characterized in that the processing conditions are corrected based on the differences in shape. Thus, the structure is processed faithfully to the designed shape. Furthermore, the system can have means for entering CAD data and obtaining data about the designed three-dimensional shape of the three-dimensional structure and means for differentiating the three-dimensional data to find plural sets of data about two-dimensional shapes perpendicular to the direction of the axis of the beam.

BRIEF DESCRIPTION OF THE DRAWINGS

FIGS. 3A-3B illustrate one phenomenon occurring in implementing the present invention and steps taken.

FIGS. 4A-4B illustrate another phenomenon occurring in implementing the present invention and steps taken.

DETAILED DESCRIPTION OF THE PREFERRED EMBODIMENTS

Figure 1:
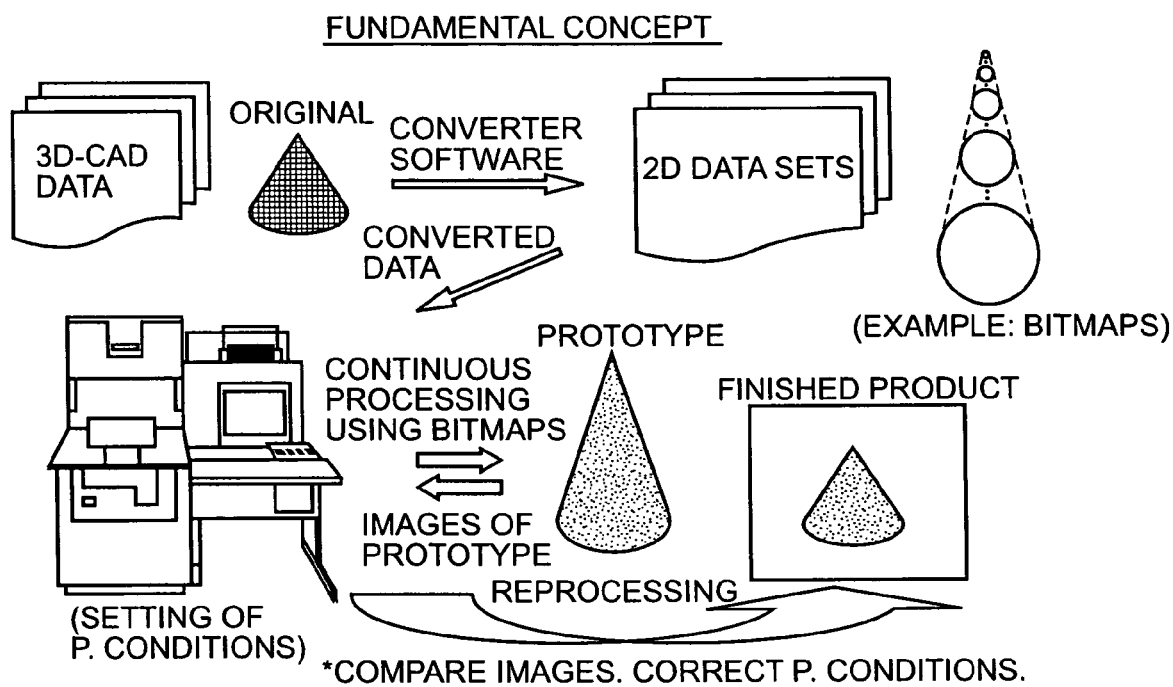
FIG. 1 is a fundamental conceptual view of the present invention.

FIG. 1 is a fundamental conceptual view of the present invention. First, it is necessary to gain data about the three-dimensional shape of a model of a microstructure to be fabricated. In this case, if there is already a reference structure, an image of this structure can be used as a model. Generally, however, designed values of the shape dimensions of the structure to be fabricated are used. For example, CAD data as shown in FIG. 1 is used. Then, a processing method implemented to fabricate the structure (original drawing in FIG. 1) having those dimensions is determined. That is, a choice is made from sputter etching, gas-assisted etching, a deposition process (hereinafter simply referred to as CVD) where a source gas is ejected while being irradiated with a focused charged-particle beam. In the following description, it is assumed that a microstructure is fabricated by CVD. Information about a number of two-dimensional cross-sectional shapes (bitmaps in the figure) that are cross-sectional shapes of quite small thickness taken by cutting the model along planes perpendicular to the axis of the charged-particle beam is calculated from the aforementioned CAD data. If these quite thin cross-sectional slices are successively stacked, a structure having the shape of the model is created. Processing data (i.e., selection of the source gas, the accelerating voltage of the focused charged-particle beam, beam current, scan rate, dot-to-dot interval, and dot duration or dot wait time (time until shifting to the next dot)) necessary to create these individual cross-sectional slices are set. The irradiation position is controlled based on the information about the two-dimensional shapes, using the processing data that is set in this way, and a provisional processing work is carried out. As a result, images of the prototype are taken from different angles and its three-dimensional shape is measured. Where a focused ion beam (FIB) system equipped with a scanning electron microscope is used, electron microscope images ar gained as the images described above. Where the used system is not fitted with the microscope, ion microscope images are gained as the images described above. In this stage, the prototype is compared with the model in terms of dimensions, and differential data is obtained. The cause of the differences is searched and analyzed from the differential data. A correction is made to the processing data necessary to correct the differences, and a setup is again performed. Under this condition, an on-provisional processing work is carried out. The fundamental concept of the inventive idea has been described so far. Where sufficient modification is not yet made and there remain great dimensional differences after the non-provisional processing work, the processing data may be again modified. A setup may be performed once more, and a non-provisional processing work may be carried out.

Embodiment 1

Figure 2A:
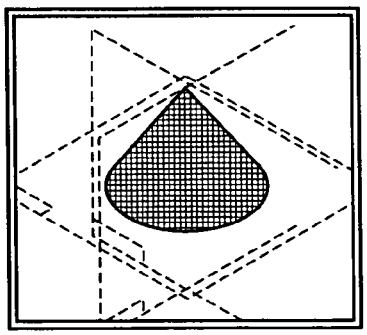
FIGS. 2A-2C show an original drawing, an image of a prototype, and a finished product, respectively, illustrating the invention.
Figure 9:
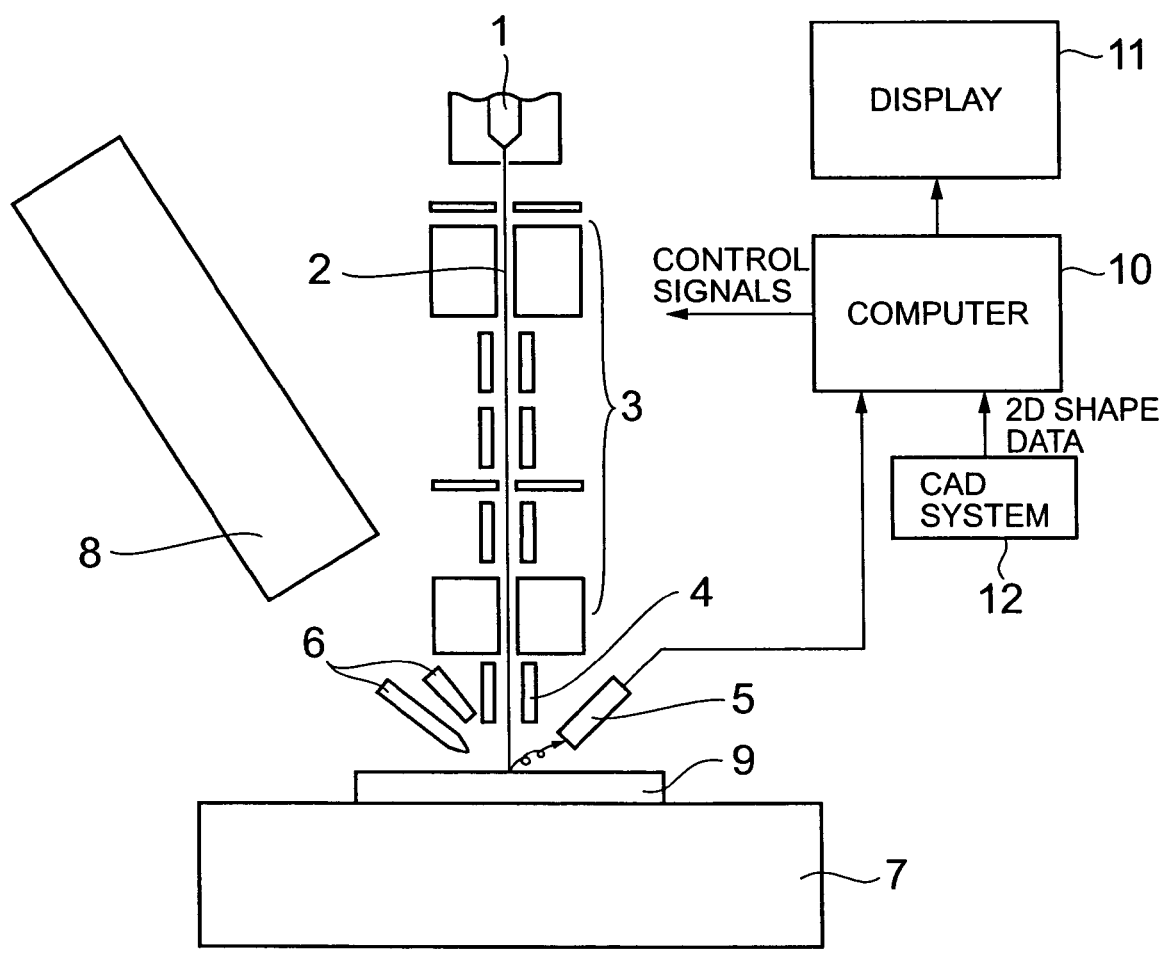
FIG. 9 is a diagram illustrating one embodiment of the invention.

A fabrication system according to the invention is described by referring to FIG. 9. This system has an FIB machine body, a scanning electron microscope column 8, a computer 10 for creating and sending control signals to the FIB machine body and to the scanning electron microscope, a display unit 11, and a CAD system 12. The FIB machine body consists of an ion source 1, an ion optical system 3, a deflector 4, a secondary charged-particle detector 5, gas guns 6, and a sample stage 7 fitted with a five-axis drive mechanism. Operations for converting information about the dimensions of a three-dimensional microstructure to be fabricated into a number of two-dimensional shapes are performed by the CAD system 12. The converted data are sent to the computer 10. At this time, it is assumed that a model indicated by the CAD information is a conic structure as shown in FIG. 2A, for example. To fabricate this structure, a deposition creation mode using CVD is selected in the present embodiment. It is also assumed that this structure is fabricated from carbon. The gas guns 6 are loaded with phenanthrene. In the present embodiment, there are provided the plural gas guns. One gun is provided for a gas used for gas-assisted etching. The other guns are employed for other materials and for different concentrations of source gas. Three-dimensional information about the model is differentiated in the Z-axis direction (ion beam axis) by the CAD system 12. Thus, plural sets of two-dimensional data are created. These correspond to information (bitmaps in FIG. 1) about the multiplicity of two-dimensional shapes that are cross-sectional slices. The two-dimensional data are sent to the computer 10 of the body of the system and used for the control of the focused ion beam (FIB). Processing conditions for forming substructures are set for the irradiating FIB. That is, beam energy (accelerating voltage or current), scan rate, dot-to-dot interval, and the number of scans are set from the processed size or processing accuracy. The setup is performed from the low-layer portion to the top-layer portion in turn. In this way, a set of processing programs is created. The present system can automatically perform a provisional processing work according to this set of programs. The prototype is created and processed. The processing conditions are set and the programs are created by the control computer 10.

Figure 2B:
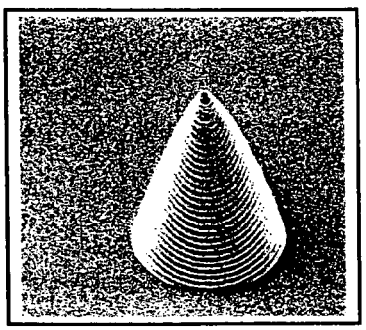
Figure 2C:
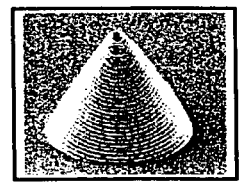

The contour of the prototyped three-dimensional structure is next observed using the functions of the scanning electron microscope using the electron beam column 8. An example of image of the prototype is shown in FIG. 2B. If necessary, the contour is observed from plural different angles by varying the electron beam irradiation angle, i.e., plural images are taken. The three-dimensional dimensions of the prototype are found. Three-dimensional CAD data are compared with the prototyped three-dimensional structures in terms of dimensions, and their differences in shape are found. It is assumed that the height b of the cone of the prototype is greater than the designed dimension (CAD drawing or original drawing) a as shown in FIG. 3A. The dotted portion in the figure is an excessive structural portion 31 compared with the original drawing. This means that the thickness of each slice in the substructure is greater than the assumed amount. Accordingly, for amendment, the thickness of each substructure should be set to a/b. Generally, the dose of the irradiating FIB is adjusted. In this embodiment, the adjustment is made by the number of scans. Of course, other method of adjusting the concentration of source gas or beam energy may also be available. The number of scans included in the processing conditions is reset to a/b, and a non-provisional processing work is carried out. As a result, a conic microstructure approximating the original drawing of the CAD drawing is formed as shown in FIG. 2C or 3B.

Then, it is assumed that the prototype is so shaped that the portion located over some height b of the conic body is thinner than the designed dimension (CAD drawing or original drawing) as shown in FIG. 4A. The dotted portion in the figure is a lacking structural portion 32 compared with the original drawing. It is understood that the cause of this deformation lies in the following phenomenon. The cross-sectional area is reduced, shortening the scan cycle. This increases the current density. As a result, the rate at which the deposition is performed is reduced.

One countermeasure to be taken in the present embodiment is to process the prototype after setting the deposition rate almost constant such that the wait time at every point across the beam is constant. This is enabled by the fact that the wait time until the beam hits the same location the next time can be controlled because the focused charged-particle beam system is performing digital scans. Specifically, at the height b, the beam is blanked at every point that does not need to be irradiated in the subsequent processing. In this way, scans are performed at the same cycle. A fundamental correction is then performed according to the degree of success of the fabrication of the prototype. If the correction is insufficient, the following corrective procedure is performed. The wait time that is one of the processing conditions is set longer such that the source gas can be sufficiently adsorbed onto the surface.

Another countermeasure to be taken in the present embodiment is to perform a processing work with a beam current directly reduced to decrease the current density instead of modifying the scan rate to adjust the wait time. This procedure has the advantage that the processing time can be reduced because wasteful time as used for blanking is not spent. However, there is the problem that it is difficult to control the timing at which the current is reduced. In this case, it is necessary to grasp the beam position accurately such that the junction of different current values is made indiscernible as much as possible. In particular, positions are accurately measured from the images of the prototype, using image processing (pattern matching) techniques.

A conic microstructure resembling the original drawing of the CAD drawing as shown in FIG. 4B is created by correcting the processing conditions by any one of the above-described procedures.

In the description provided so far, a microstructure is created using CVD making use of a focused ion beam (FIB). In the present invention, a microstructure can also be fabricated by etching a material in the form of a block or a plate-like material obtained by lamination. Also, in this case, a provisional processing work is performed based on data about the designed three-dimensional shape of a three-dimensional structure by controlling the processing conditions including the beam energy of the charged particles, scan rate, and dot-to-dot interval. Thus, a prototypic structure is first created. Then, the shape of this prototypic structure is compared with the designed shape. A non-provisional processing work is performed while correcting the processing conditions so as to correct the differences.

Figure 5:
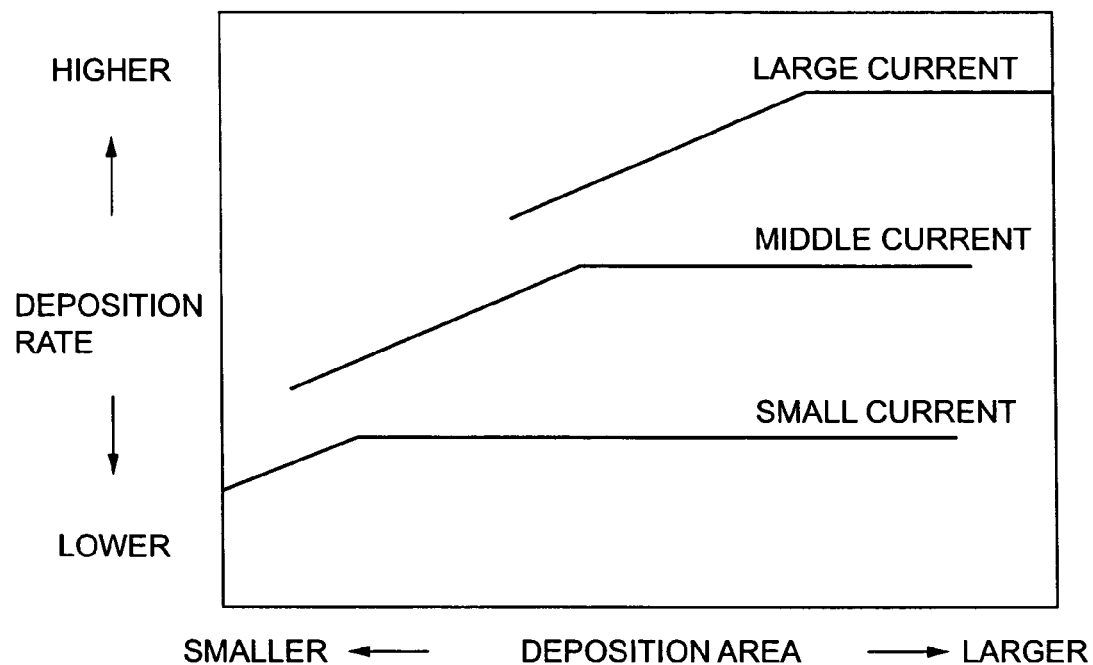
FIG. 5 is a graph illustrating the characteristics of the relation between the used deposition area and the deposition rate.

A procedure for correcting the processing conditions to perform a processing work more accurately in accordance with the present invention is described in detail. An accurate processing work can be performed effectively by previously obtaining plural sets of characteristic data indicating the relation between the processed area and the deposition rate for each different beam current used for the processing and grasping the characteristics. The characteristics generally take the form of broken lines as shown in FIG. 5. As can be seen from this graph, for any individual beam current, the deposition rate decreases in the smaller-area region demarcated by some processed area. In the final region, no deposition occurs but etching owing to beam irradiation is performed. These characteristics have been obtained under the same number of scans, the number being one of the processing conditions. The processing can be carried out considerably accurately even in a first preliminary processing work by grasping the characteristic data, adjusting the processing conditions, and performing the ion beam processing.

Conceivable methods of varying the processing conditions utilizing the characteristics described above include:

1) Method of calculating the beam wait time from the decreasing characteristic data.

2) Method of performing a processing work by combining some beam currents to avoid the use of decreasing regions.

3) Method of performing a processing work by increasing the number of beam scans (deposition time) by a value equal to the amount of decrease.

A complex three-dimensional microstructure can be created based on CAD data by performing a processing work while adjusting the processing conditions using any one of these methods.

Figure 6:
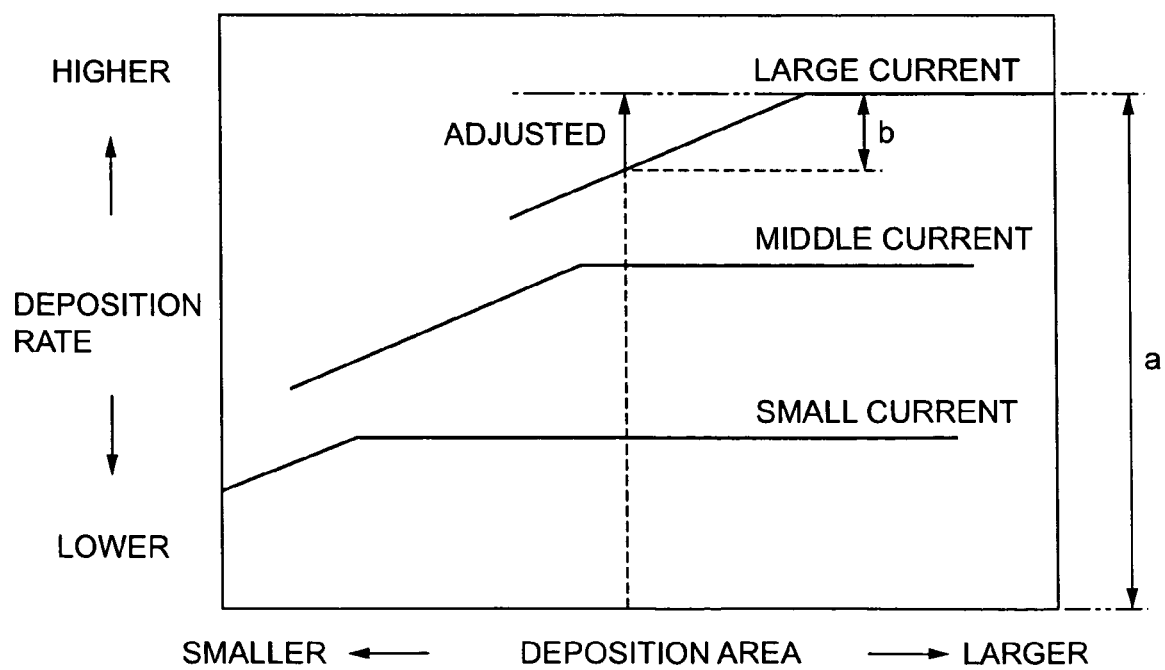
FIG. 6 is a graph illustrating a method of calculating the amount by which the wait time of the beam scans is adjusted from decreasing characteristic data.

First, the method 1) of calculating the beam wait time from the decreasing characteristic data and making an adjustment is described. A proportional relation exists between the thickness of the film formed by deposition and the number of scans (dose). The phenomenon that the deposition rate decreases is considered to arise from a decrease in the processed cross-sectional area. In particular, this shortens the scan cycle, thus increasing the current density. Accordingly, in this method, a beam wait time is established between from when one scan is completed and when the next scan is started, to compensate for the lack of gas adsorption. In this way, the deposition is promoted. Let S be the cross-sectional area of the portion where deposition is performed. In the case of characteristics shown in FIG. 6, the deposition rate at a large current is lower than the deposition rate a at portions having large deposition areas by b. In this case, the corrective wait time is set according to b/a to compensate for the lack b. Consequently, the maximum deposition rate a can be maintained. That is, the value of b increases gradually as the deposition area S decreases. The wait time is set longer accordingly. In this way, the deposition rate a is maintained. In this case, of course, it is assumed that the number of scans that is one of the processing conditions is kept constant.

Figure 7:
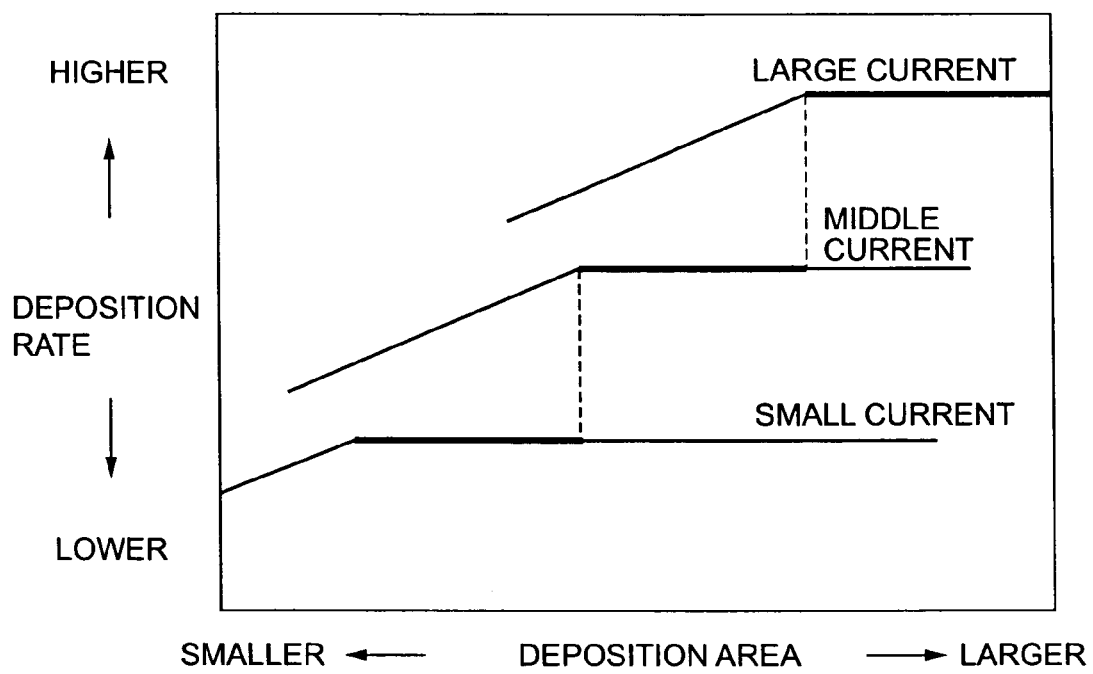
FIG. 7 is a graph illustrating a method of switching the beam current by using only the maximum deposition rate.

Adjustment in the method 2) of performing a processing work by combining the maximum deposition rate portions of some beam currents to avoid the use of regions where the deposition rate decreases is described in detail. In this method, the beam current is set switchable between different values. In each characteristic, the region where the deposition rate decreases is not used. The beam current is switched to a lower value in a region where the deposition area decreases. An efficient processing work is done using the maximum deposition rate at this current. This method is schematically shown in FIG. 7. First, the maximum rate region up to the kink portion of a large beam current is used and a processing work is performed. The beam current is switched to the next greatest value in that portion. The maximum rate region is used up to the kink portion of that beam current. The switching is made in turn similarly subsequently. Of course, in this case, the number of scans at each beam current is assumed to be kept constant, the number of scans being one of the processing conditions.

Figure 8:
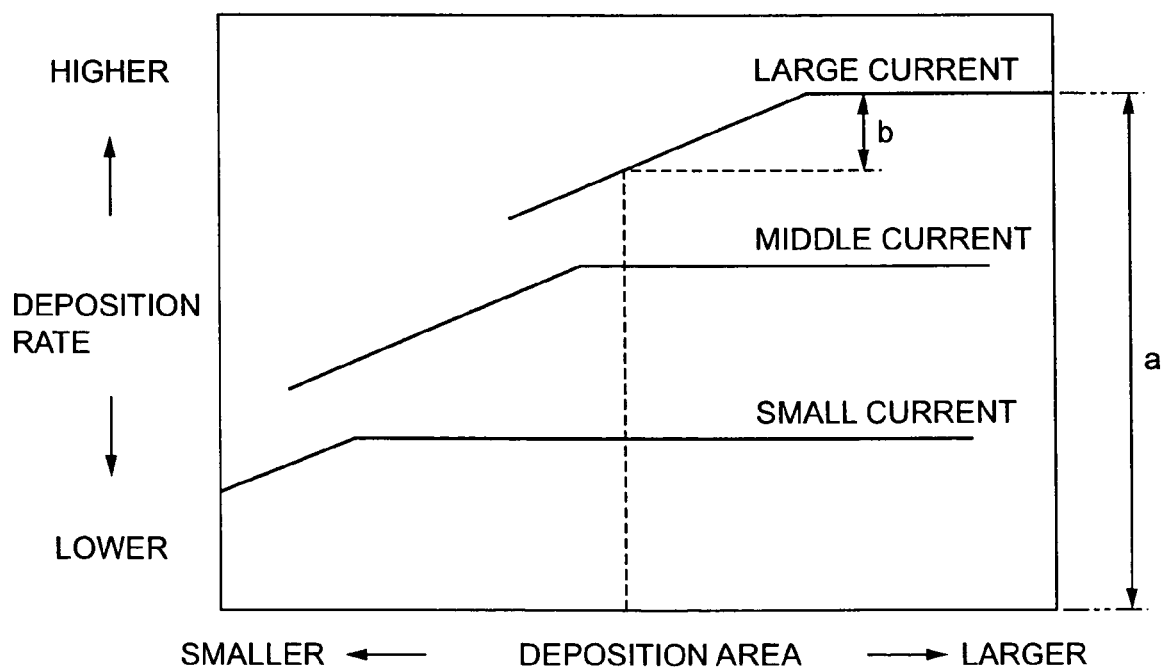
FIG. 8 is a graph illustrating a method of calculating the amount by which the number of beam scans is adjusted from decreasing characteristic data.

Finally, the method 3) of performing a processing work while increasing the number of beam scans (deposition time) by a value corresponding to the amount of decrease is described. As mentioned previously, there is a proportional relation between the thickness of the film formed by deposition and the number of scans (dose). Let S be the cross-sectional area of the portion where deposition is performed. In the case of characteristics shown in FIG. 8, the deposition rate at large currents is lower than the deposition rate a in portions having large deposition areas by b. Accordingly, where a processing work is performed with the same number of scans, the thickness of the film formed by deposition on this portion is (a−b)/a compared with the thickness of the film formed by deposition in locations having wide deposition areas. To compensate for this lack, i.e., to achieve the same thickness, the number of scans is increased by b/a.

The method of fabricating a three-dimensional microstructure in accordance with the present invention starts with creation of a prototypic structure by performing a provisional processing work based on data about the designed three-dimensional shape of the three-dimensional structure by controlling the processing conditions including the beam energy of the charged particles, scan rate, and dot-to-dot interval. Then, the shape of the prototypic structure is compared with the designed three-dimensional shape. A non-provisional processing work is done while correcting the processing conditions to correct the differences. Consequently, a three-dimensional microstructure can be fabricated faithfully to the designed shape at an accuracy of submicrometer to nanometer order.

With respect to data about the designed three-dimensional shape of a three-dimensional structure, CAD data is taken in, and plural sets of data about two-dimensional shapes to be processed can be easily found by differentiation. Formation and processing of the three-dimensional microstructure can be easily carried out by controlling the position hit by the charged-particle beam based on the data about the two-dimensional shapes.

In the method of creating a three-dimensional microstructure in accordance with the present invention, plural sets of characteristic data indicating the relation between the processed area and the deposition rate are obtained in advance. The conditions under which a structure is processed by a charged particle beam are found by any one of the following methods:

(1) The wait time of the beam scan is adjusted by an amount equal to the (decrease in rate value)/(maximum rate value) according to the decrease in the deposition rate. The same numbers of scans are performed.

(2) A processing work is first performed using a maximum rate region up to the kink portion of a large beam current. The beam current is switched to the next greatest value in that portion. The maximum rate region is used up to the kink portion of that beam current. Subsequently, the beam current is switched in turn similarly.

(3) The number of repetitions of the beam scan is increased by an amount equal to (decrease in rate value)/(maximum rate value) according to the decrease in the deposition rate. In this way, scans are made.

Therefore, an accurate processing work can be reliably executed while grasping the state of the processed work corresponding to the processing conditions. Consequently, a three-dimensional structure close to the designed shape can be processed efficiently without repeating a prototypic work.

A focused charged-particle beam system used for fabricating a three-dimensional microstructure in accordance with the invention has means for obtaining data about a designed three-dimensional shape of the three-dimensional structure, means for controlling the position hit by the charged-particle beam based on the data about the shape, means for controlling processing conditions including beam energy, scan rate, and dot-to-dot interval, means for obtaining images for grasping the three-dimensional shape of the processed structure, and means for comparing the images with the designed shape. The processing conditions are corrected based on the differences in shape. Consequently, the three-dimensional structure can be processed faithfully to the designed shape at an accuracy of submicrometer to nanometer order.

Means for obtaining data about the designed three-dimensional shape of the three-dimensional structure by entering CAD data and means for finding plural sets of data about two-dimensional shapes perpendicular to the direction of the beam axis by differentiating the three-dimensional data are provided. The processing conditions are set in turn from the low-layer substructure to the top-layer substructure. Thus, a set of processing programs is created. The present system can automatically perform a provisional processing work according to the programs.

What is claimed is:

1. A method of fabricating a three-dimensional microstructure, comprising the steps of:
    forming a prototypic structure in accordance with data corresponding to a designed three-dimensional shape of the three-dimensional microstructure by scanning a sample with a beam produced by a charged-particle beam system while controlling processing conditions thereof;
    comparing the shape of the formed prototypic structure with the designed three-dimensional shape of the three-dimensional microstructure to identify differences between the shape of the prototypic structure and the designed three-dimensional shape of the three-dimensional microstructure; and
    processing the prototypic structure to correct the differences identified in the comparing step by scanning the prototypic structure with a beam produced by the charged-particle beam system while adjusting the processing conditions thereof to thereby fabricate a three-dimensional microstructure having a shape corresponding substantially to the designed three-dimensional shape.

2. A method of fabricating a three-dimensional microstructure as set forth in claim 1; wherein the processing conditions of the charged-particle beam system include accelerating voltage, beam current, scan rate, dot-to-dot interval, and dot duration.

3. A method of fabricating a three-dimensional microstructure as set forth in claim 1; wherein the step of adjusting the processing conditions comprises the steps of obtaining characteristic data indicating a relation between processed area and deposition rate corresponding to a current of the beam and adjustably increasing the duration of the beam scans by a value corresponding to the ratio (decrease in rate value)/(maximum rate value) in accordance with a decrease in the deposition rate.

4. A method of fabricating a three-dimensional microstructure as set forth in claim 1; wherein the step of adjusting the processing conditions comprises the steps of obtaining characteristic data corresponding to a relation between processed area and deposition rate for each value of a current of the beam, processing the prototypic structure by using a maximum rate region up to a kink portion of one of the beam current values, switching the beam current to a next greatest value in the kink portion and using the maximum rate region up to a kink portion of the beam current with the next greatest value, and repeating the switching step until the differences obtained from the comparing step are corrected.

5. A method of fabricating a three-dimensional microstructure as set forth in claim 2; wherein the step of adjusting the processing conditions comprises the steps of obtaining characteristic data indicating a relation between processed area and deposition rate corresponding to a current of the beam and adjustively increasing a number of repetitions of the beam scan by a value equal to the ratio (decrease in rate value)/(maximum rate value) in accordance with a decrease in the deposition rate.

6. A method of fabricating a three-dimensional microstructure as set forth in claim 1; wherein the data corresponding to the designed three-dimensional shape of the three-dimensional microstructure comprises CAD data; and wherein the forming step includes the steps of obtaining plural sets of data corresponding to plural two-dimensional shapes of the microstructure by differentiation and controlling a position scanned by the beam in accordance with the plural sets of data.

7. A method of fabricating a three-dimensional microstructure, comprising the steps of:
  providing data corresponding to information relating to the structure of a three-dimensional microstructure design;
  a first processing step of processing a sample in accordance with the provided data by irradiating the sample with a charged-particle beam while controlling processing conditions of the charged-particle beam;
  comparing dimensions of the processed sample with the provided data to identify differences between the structure of the processed sample and the structure of the three-dimensional microstructure design; and
  a second processing step of processing the sample by irradiating the sample with a charged-particle beam to correct the structural differences identified in the comparing step while adjusting the processing conditions of the charged-particle beam to thereby fabricate a three-dimensional microstructure having a structure substantially the same as the structure of the three-dimensional microstructure design.

8. A method according to claim 7; wherein the providing step comprises providing CAD data.

9. A method according to claim 7; wherein the processing conditions of the charged-particle beam comprise at least one of an accelerating voltage, current, scan rate, dot-to-dot interval, and dot duration of the charged-particle beam.

10. A method according to claim 7; wherein the providing step includes the step of differentiating the information relating to the structure of the three-dimensional microstructure design in a direction of an axis of the charged-particle beam to provide a plurality of sets of two-dimensional data; and wherein the first processing step comprises the step of processing the sample in accordance with the sets of two-dimensional data while controlling processing conditions of the charged-particle beam.

11. A method according to claim 10; wherein the processing conditions of the charged-particle beam comprise at least one of an accelerating voltage, current, scan rate, dot-to-dot interval, and dot duration of the charged-particle beam.

12. A method according to claim 7; wherein the charged particle beam comprises a focused ion beam.

13. A method according to claim 7; wherein the information relating to the structure of the three-dimensional microstructure design comprises information relating to at least one of dimensions and a three-dimensional shape of the three-dimensional microstructure design.

14. A method of fabricating a three-dimensional microstructure, comprising the steps of:
  forming a prototypic structure in accordance with CAD data corresponding to a designed three-dimensional shape of the three-dimensional microstructure by scanning a sample with a beam produced by a charged-particle beam system while controlling processing conditions thereof;
  comparing the shape of the formed prototypic structure with the designed three-dimensional shape of the three-dimensional microstructure to identify differences between the shape of the prototypic structure and the designed three-dimensional shape of the three-dimensional microstructure; and
  processing the prototypic structure to correct the differences identified in the comparing step by scanning the prototypic structure with a beam produced by the charged-particle beam system while adjusting the processing conditions thereof to thereby fabricate a three-dimensional microstructure having a shape corresponding substantially to the designed three-dimensional shape.

15. A method of fabricating a three-dimensional microstructure as set forth in claim 14; wherein the processing conditions of the charged-particle beam system include accelerating voltage, beam current, scan rate, dot-to-dot interval, and dot duration.

16. A method of fabricating a three-dimensional microstructure as set forth in claim 14; wherein the step of adjusting the processing conditions comprises the steps of obtaining characteristic data indicating a relation between processed area and deposition rate corresponding to a current of the beam and adjustably increasing the duration of the beam scans by a value corresponding to the ratio (decrease in rate value)/(maximum rate value) in accordance with a decrease in the deposition rate.

17. A method of fabricating a three-dimensional microstructure as set forth in claim 14; wherein the step of adjusting the processing conditions comprises the steps of obtaining characteristic data corresponding to a relation between processed area and deposition rate for each value of a current of the beam, processing the prototypic structure by using a maximum rate region up to a kink portion of one of the beam current values, switching the beam current to a next greatest value in the kink portion and using the maximum rate region up to a kink portion of the beam current with the next greatest value, and repeating the switching step until the differences obtained from the comparing step are corrected.

18. A method of fabricating a three-dimensional microstructure as set forth in claim 14; wherein the step of adjusting the processing conditions comprises the steps of obtaining characteristic data indicating a relation between processed area and deposition rate corresponding to a current of the beam and adjustively increasing a number of repetitions of the beam scan by a value equal to the ratio (decrease in rate value)/(maximum rate value) in accordance with a decrease in the deposition rate.

* * * * *